United States Patent
Takagi

(10) Patent No.: US 7,177,337 B2
(45) Date of Patent: Feb. 13, 2007

(54) SEMICONDUCTOR OPTICAL INTEGRATED CIRCUIT

(75) Inventor: Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 263 days.

(21) Appl. No.: 10/739,068

(22) Filed: Dec. 19, 2003

(65) Prior Publication Data

US 2004/0190126 A1   Sep. 30, 2004

(30) Foreign Application Priority Data

Mar. 24, 2003   (JP) ............................. 2003-079980

(51) Int. Cl.
*H01S 3/03*   (2006.01)

(52) U.S. Cl. ........................................ 372/64; 359/344

(58) Field of Classification Search ................. 372/20, 372/94, 92; 385/8, 10; 359/326
See application file for complete search history.

(56) References Cited

U.S. PATENT DOCUMENTS

| | | | | |
|---|---|---|---|---|
| 4,111,521 A | * | 9/1978 | Streifer et al. ............. | 372/50.1 |
| 5,088,105 A | * | 2/1992 | Scifres et al. ................. | 372/92 |
| 5,091,983 A | * | 2/1992 | Lukosz ........................ | 385/13 |
| 5,388,106 A | * | 2/1995 | Tabuchi ....................... | 372/20 |
| 5,654,822 A | * | 8/1997 | Ducellier et al. ........... | 359/344 |
| 5,699,465 A | * | 12/1997 | Nakaya ........................ | 385/41 |
| 6,005,708 A | * | 12/1999 | Leclerc et al. .............. | 359/326 |
| 6,061,481 A | * | 5/2000 | Heidrich et al. .............. | 385/14 |
| 6,400,490 B1 | * | 6/2002 | Hosoi .......................... | 359/254 |
| 6,563,627 B2 | * | 5/2003 | Yoo ............................ | 359/326 |
| 6,614,582 B1 | * | 9/2003 | Mikkelsen et al. .......... | 359/326 |
| 6,643,305 B2 | * | 11/2003 | Bewley et al. ............ | 372/45.01 |

FOREIGN PATENT DOCUMENTS

JP    1-170084    7/1989

OTHER PUBLICATIONS

X. Pan et al.; "Intensity Noise Characteristics of a Mach-Zehnder Wavelength Converter"; IEEE Photonics Technology Letters, vol. 7, No. 11, Nov. 1995; pp. 1276-1278.
Lucas B. Soldano, et al.; "Optical Multi-Mode Interferences Devices Based on Self-Imaging: Principles and Applications"; Journal of Lightware Technology; vol. 13, No. 4, Apr. 1995; pp. 615-627.
SOA 1550 CRI Optical Amplifier Chip 1.55 μm—Window; Opto Speed™; Rev. Sep. 2001.
SOA 1300CRI Optical Amplifier Chip 1.30 μm—Window; Opto Speed™; Rev. Sep. 2001.
SOA 1300 CRI/X-1500; Optical Amplifier Chip 1.3 μm—Window; Opto Speed™; Rev. Sep. 2001.
SOA 1550 CRI/S-1500 CRI Optical Amplifier Chip 1.55 μm—Window; Opto Speed™; Rev. Sep. 2001.

* cited by examiner

*Primary Examiner*—Minsun Oh Harvey
*Assistant Examiner*—Tuan N. Nguyen
(74) *Attorney, Agent, or Firm*—Leydig, Voit and Mayer, Ltd.

(57) ABSTRACT

A semiconductor optical integrated circuit includes: a semiconductor substrate; a light reflecting portion and a gain region, on the semiconductor substrate; a first optical waveguide connecting the reflecting portion and the gain region; and a second optical waveguide in conjunction with the first optical waveguide and having a larger optical absorptance than the first optical waveguide.

8 Claims, 4 Drawing Sheets

SEMICONDUCTOR OPTICAL INTEGRATED CIRCUIT

CROSS-REFERENCE TO RELATED APPLICATION

The present application claims the benefit of patent application No. 2003-79980 filed in Japan on Mar. 24, 2003, the subject matter of which is hereby incorporated herein by reference.

BACKGROUND OF THE INVENTION

1. Field of the Invention

The present invention relates to an optical integrated circuit and, more particularly, to an optical integrated circuit used for an optical fiber communication system and for an optical disk device.

2. Description of the Related Art

A conventional interference circuit such as a wavelength converter has a pair of gain regions which are formed parallel to each other on a semiconductor substrate. The gain region has an optical amplifier which amplifies an incident light by applying forward current between the electrodes, and performs an operation using nonlinear optical effect. At least two Y optical couplers are formed on the semiconductor substrate. The optical coupler and the gain region are connected by an optical waveguide.

An incident light into a semiconductor optical amplifier circuit is demultiplexed by an optical coupler, transmitted through an optical waveguide to each gain region, and then amplified in the each gain region. The light amplified in the gain region is transmitted to another optical coupler and multiplexed, and then emitted from the circuit as an emitting light (IEEE PHOTONICS TECHNOLOGY LETTERS, Vol. 13, No. 6, JUNE, 2001, pp.600–602)

When the length of the gain region of the circuit is relatively long and therefore the gain is large, an unintended laser oscillation (i.e., parasitic oscillation) is occurred by the reflection of spontaneous emission light generated in the gain region on the optical couplers provided on the opposite sides of the gain region. Therefore, a problem may occur that the laser oscillation introduces a noise into the laser signal. Where the optical coupler includes an embedded optical waveguide (e.g., 1.5 μm in width, 200 nm in thickness) having an InGaAsP core layer formed on an InP substrate, the residual reflectance is about one percent for the light of 1.5 μm in wave length, for example.

The gain in the gain region of the circuit should be made smaller by shortening the length of the gain region, for example, to eliminate the parasitic oscillation, which results in that a higher amplification can not be obtained in the circuit.

SUMMARY OF THE INVENTION

The object of the present invention is to obtain an optical integrated circuit having large optical gain in a gain region without generating parasitic oscillation.

The present invention provides a semiconductor optical integrated circuit includes: a semiconductor substrate; a light reflecting portion and a gain region, formed on the semiconductor substrate; a first optical waveguide connecting between the reflecting portion and the gain region; and a second optical waveguide formed in conjunction with the first optical waveguide and having a larger optical absorptance than that of the first optical waveguide.

As the optical integrated circuit has the second optical waveguide, the light reflected on the reflecting portion can be absorbed by the second optical waveguide. Hereby, the optical gain of the gain region can be enlarged without causing any parasitic oscillation by the reflected light entering into the gain region.

DETAILED DESCRIPTION OF THE PREFERRED EMBODIMENTS

Embodiment 1

Figure 1:
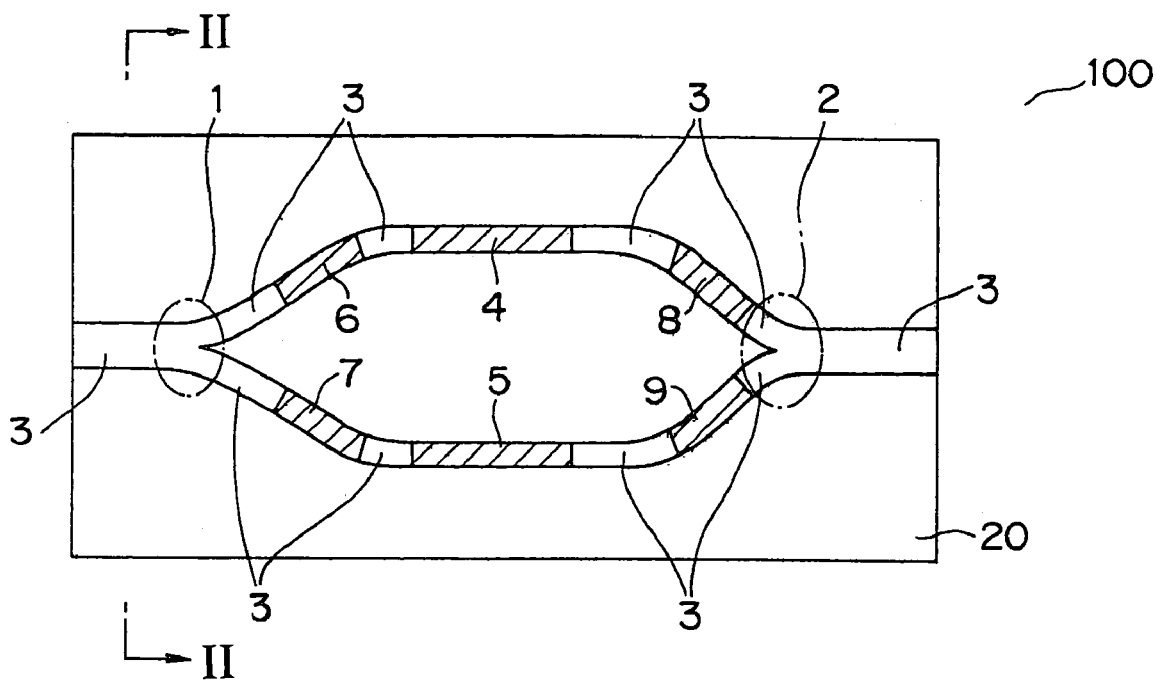
FIG. 1 is a schematic top view of an optical integrated circuit according to the first embodiment of the present invention.

FIG. 1 is a schematic top view of an optical integrated circuit of the first embodiment according to the present invention, generally denoted at 100.

As shown in FIG. 1, the optical integrated circuit 100 has a semiconductor substrate 20 made of InP, for example. Two gain regions 4 and 5 are formed on the semiconductor substrate 20 in a certain direction parallel to each other. First optical waveguides 3 are connected to the opposite ends of the gain region 4, and a Y optical couplers 1 and 2 are respectively connected to the first optical waveguides 3 through second optical waveguide 6 or 8. Furthermore, first optical waveguides 3 are connected to the opposite ends of the gain region 5, and a Y optical couplers 1 and 2 are respectively connected to the first optical waveguides 3 through second optical waveguide 7 or 9.

Each of the second optical waveguides 6, 7, 8 and 9 has a core layer of a semiconductor material having smaller energy gap than that of the first optical waveguide 3. Consequently, each of the second optical waveguides 6, 7, 8 and 9 has a higher optical absorption characteristic than that of the first optical waveguide 3, so that it absorbs a reflected light, which will be described hereinafter.

Figure 2:
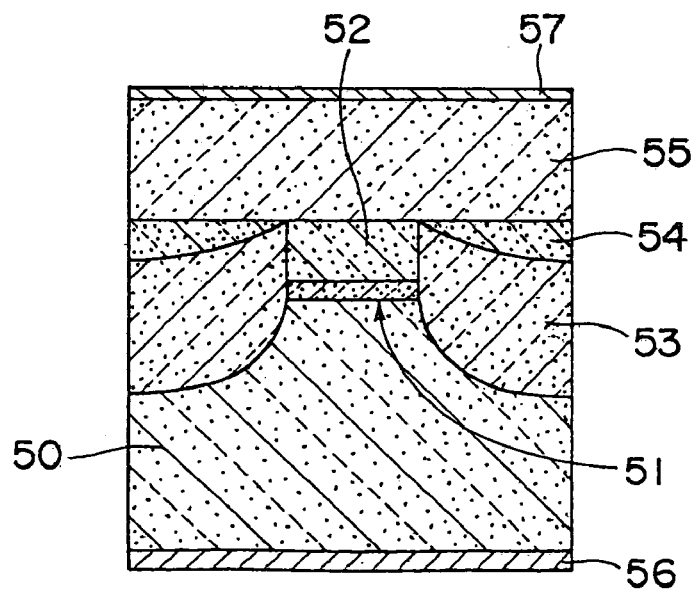
FIG. 2 is a cross-sectional view of the optical integrated circuit according to the first embodiment of the present invention.

FIG. 2 is a cross-sectional view of the first optical waveguide 3 taken on line II—II of FIG. 1. As shown in FIG. 2, an InGaAsP core layer 51 and an InP layer 52, sandwiched between InP block layers 53 and 54, are formed on an InP substrate 50. An InP cladding layer 55 is formed on the InP layer 52. A Ti/Au cathode electrode 56 is formed on the back surface of the InP substrate 50. The front surface of the InP cladding layer 55 is covered with an insulating film 57 of SiO$_2$. As described above, the first optical waveguide 3 is formed by cladding the InGaAsP core layer 51 between the InP substrate 50 and the InP layer 52.

Each second optical waveguides 6, 7, 8 and 9 has the similar cross-sectional structure to that of the first optical waveguide 3 except that the composition of the InGaAsP core layer defines smaller band gap than that of the first optical waveguide 3.

The cross-sectional structure of the gain regions 4 and 5 is similar to that of the first optical waveguide 3 except that a part of the insulating film 57 is removed and the anode electrode is provided instead.

Each of the second optical waveguides 6, 7, 8 and 9 can be replaced by an optical amplifier having the same structure as that of the gain regions 4 and 5. In this instance, the optical amplifier is driven with lower current so that the loss of the incident light is generated or the gain of the incident light, if any, becomes smaller. Alternatively, the anode and the cathode may be short-circuited by wire or the like.

The operation of the optical integrated circuit 100 will now be briefly described. In the optical integrated circuit 100, the gain region has gain A, the second optical waveguides 6 and 8 have optical absorptivity L, the Y optical coupler 1 has reflectance R1, and the Y optical coupler 2 has reflectance R2. The loop gain of the reflected light, which is reflected on the optical couplers 1 and 2 and then transmitted into the gain region 4, should be smaller than 1 to avoid the parasitic oscillation of the optical integrated circuit 100. This means that the gain A, the optical absorptivity L, and the reflectance R1 and R2 need to fill the following equation 1

$$A \cdot L \cdot R1 \cdot R2 < 1 \qquad (1)$$

Consequently, in the optical integrated circuit. 100 including the second optical waveguides 6 and 8 having the optical absorptivity of L, the gain A of the gain region 4 becomes 1/L times as much as that of conventional circuit (L=1) without generating the parasitic oscillation.

The optical absorptivity L is calculated by the following equation: L=exp(-α·l), where α is an optical absorption coefficient and l is a length. Therefore, the optical absorptivity L of the second optical waveguides 6 and 8 is calculated with 0.3, where the absorption coefficient α of the second optical waveguide is 20 cm$^{-1}$ and the length of the second optical waveguide is 600 μm.

Consequently, if R1 and R2 are one percent, the parasitic oscillation occurs when the gain A exceeds 30,000, which is three times as much as the critical gain of 10,000 in the conventional optical integrated circuit.

Embodiment 2

Figure 3:
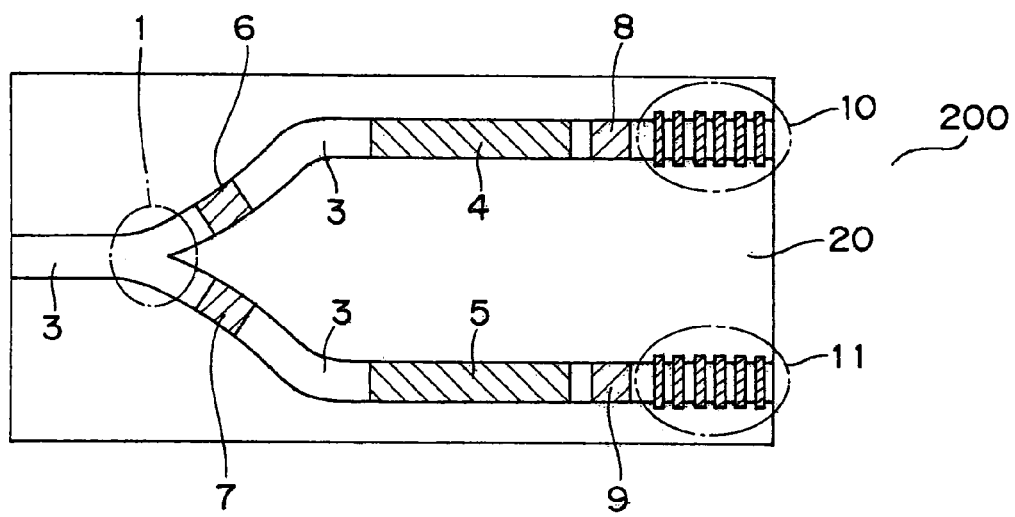
FIG. 3 is a schematic top view of a semiconductor optical amplifier circuit according to the second embodiment of the present invention.

FIG. 3 is a schematic top view of a semiconductor optical amplifier circuit of the second embodiment according to the present invention, generally denoted at 200. The numerals which are identical with those of FIG. 1 denote identical or corresponding components.

The optical waveguides 3 of the semiconductor optical amplifier circuit 200 has diffraction gratings 10 and 11, which are used in a distributed feedback semiconductor laser for instance, instead of the optical coupler 2 of the optical integrated circuit 100 described above. The diffraction gratings 10 and 11 are formed on the InGaAsP core layer of the optical waveguide, 3 across the InP layer of 100 nm in thickness, for instance. As shown in FIG. 3, the diffraction gratings. 10 and 11 are formed along the wave direction of the light and having a thickness (in the horizontal direction of FIG. 3) and a width (in the longitudinal direction of FIG. 3) of about 20 nm–80 nm and about 1.5 μm, respectively.

The incident light is, partially reflected by the diffraction gratings 10 and 11 which are formed above the optical waveguide 3. For instance, the incident light from the left end of the semiconductor optical amplifier circuit 200 is demultiplexed in the optical coupler 1, and then amplified in the gain regions 4 and 5 and reaches the diffraction gratings 10 and 11. The light reflected on the diffraction gratings 10 and 11 then reentering into the gain regions 4 and 5 causes the parasitic oscillation.

In the embodiment 2, second optical waveguides 6 and 7 are formed between the optical coupler 1 and gain regions 4 and 5, respectively. Furthermore, second optical waveguides 8 and 9 are formed between the gain regions 4 and 5 and the diffraction gratings 10 and 11, respectively.

Hereby, amount of the light reflected by the diffraction gratings 10 and 11 is reduced, so that no parasitic oscillation is generated in the gain regions 4 and 5. Consequently, the optical gain in the gain regions 4 and 5 can be increased.

Embodiment 3

Figure 4:
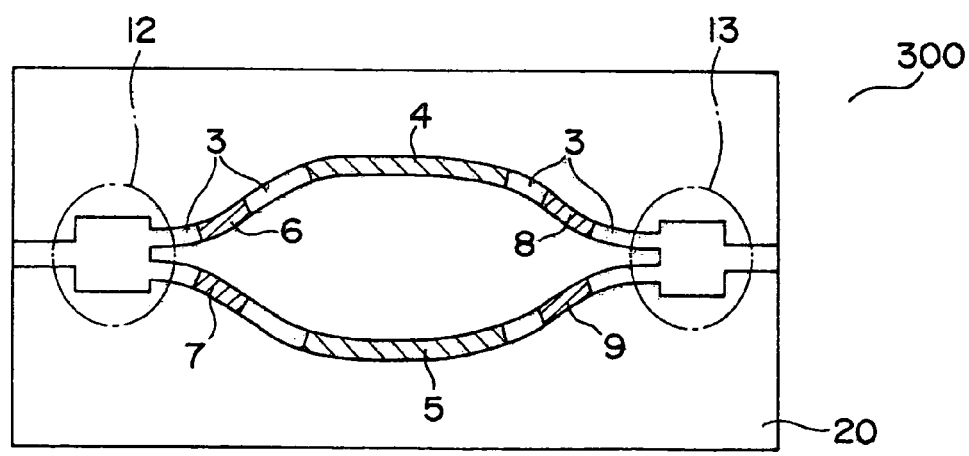
FIG. 4 is a schematic top view of a semiconductor optical integrated circuit according to the third embodiment of the present invention.

FIG. 4 is a schematic top view of a semiconductor optical amplifier circuit of the third embodiment according to the present invention, generally denoted at 300. The numerals which are identical with those of FIG. 1 denote identical or corresponding components.

In the semiconductor optical amplifier circuit 300, 2:1 MMI (Multimode Interferometric) type optical couplers 12 and 13, for instance, are formed instead of the optical couplers 1 and 2 of the optical integrated circuit 100 described above. All other elements of the semiconductor optical amplifier circuit 300 are similar to those of the optical integrated circuit 100.

In the semiconductor optical amplifier circuit 300, the light reflected on the MMI type optical couplers 12 and 13 is absorbed in the second optical waveguides 6 and 7 formed between the gain regions 4 and 5 and the optical couplers 12 and 13. Hereby, no parasitic oscillation is generated in the gain regions 4 and 5, so that the optical gain can be increased.

Embodiment 4

Figure 5:
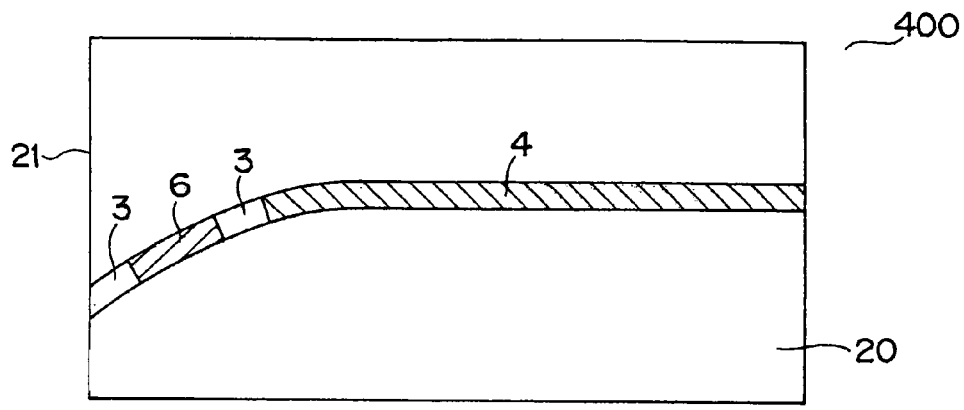
FIG. 5 is a schematic top view of a semiconductor optical amplifier according to the fourth embodiment of the present invention.

FIG. 5 is a partial schematic view of a semiconductor optical amplifier of the fourth embodiment according to the present invention, generally denoted at 400. In FIG. 5, the numerals which are identical with those of FIG. 1 denote identical or corresponding components. In the semiconductor optical amplifier 400, the second optical waveguide 6 is formed between the end face 21 which the light passes and the gain region 4.

Generally, the end face, which the light passes, of an optical integrated circuit is coated with a dielectric multilayer film, alumina for example, so that the reflectance of the light (incident light and/or emitting light) on the end face is decreased. However, it is difficult to make the reflectance smaller over the large wavelength range. As shown in FIG. 5, the optical waveguide 3 inclines from the normal line of the end face 21 and is connected to the end face 21, so that the reflectance substantially becomes smaller. In this structure, however, the reflectance is still about ten percent of that of the structure in which the optical waveguide 3 is connected perpendicularly to the end face 21.

In the semiconductor optical amplifier 400, the second optical waveguide 6 is formed between the end face 21 and the gain region 4 to absorb the residual reflected light.

Consequently, the optical gain in the gain region 4 can be larger without generating the parasitic oscillation in the gain region 4.

Figure 6:
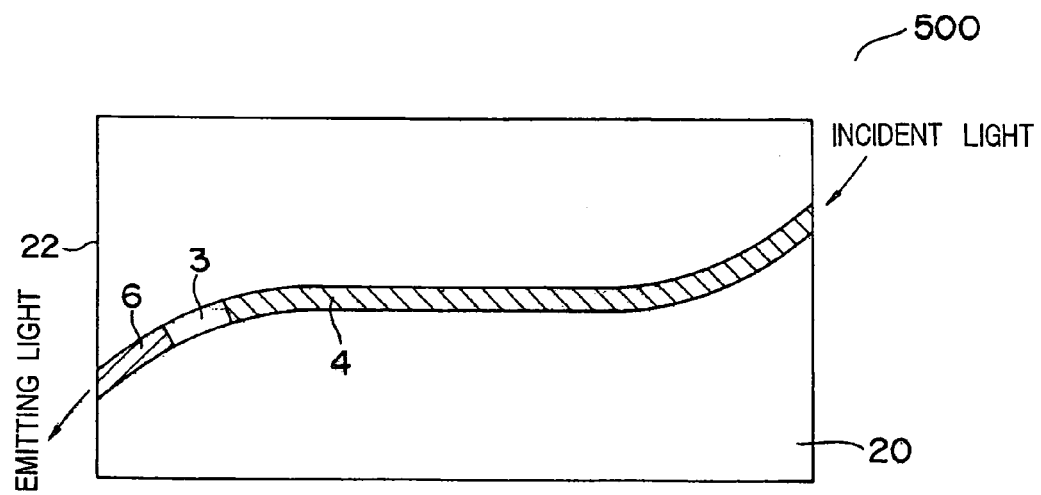
FIG. 6 is a schematic top view of another semiconductor optical amplifier according to the fourth embodiment of the present invention.

FIG. 6 is a partial schematic view of another semiconductor optical amplifier of the fourth embodiment according to the present invention, generally denoted at 500. In FIG. 6, the numerals which are identical with those of FIG. 1 denote identical or corresponding components. In the semiconductor optical amplifier 500, the second optical waveguide 6 is formed between the end face 22 through which the light is emitted and the gain region 4.

Generally, the S/N ratio of the semiconductor optical amplifier is deteriorated by a spontaneous emission light generated in the optical amplifier. In the semiconductor optical amplifier 500, the second optical waveguide 6 is formed between the end face 22 and the gain region 4 to absorb the reflected light on the end face 22, so that the parasitic oscillation is not generated and the noise caused by the spontaneous emission light can be attenuated. Consequently, the Noise Figure (NF) of the optical amplifier 500 can be smaller.

Embodiment 5

Figure 7:
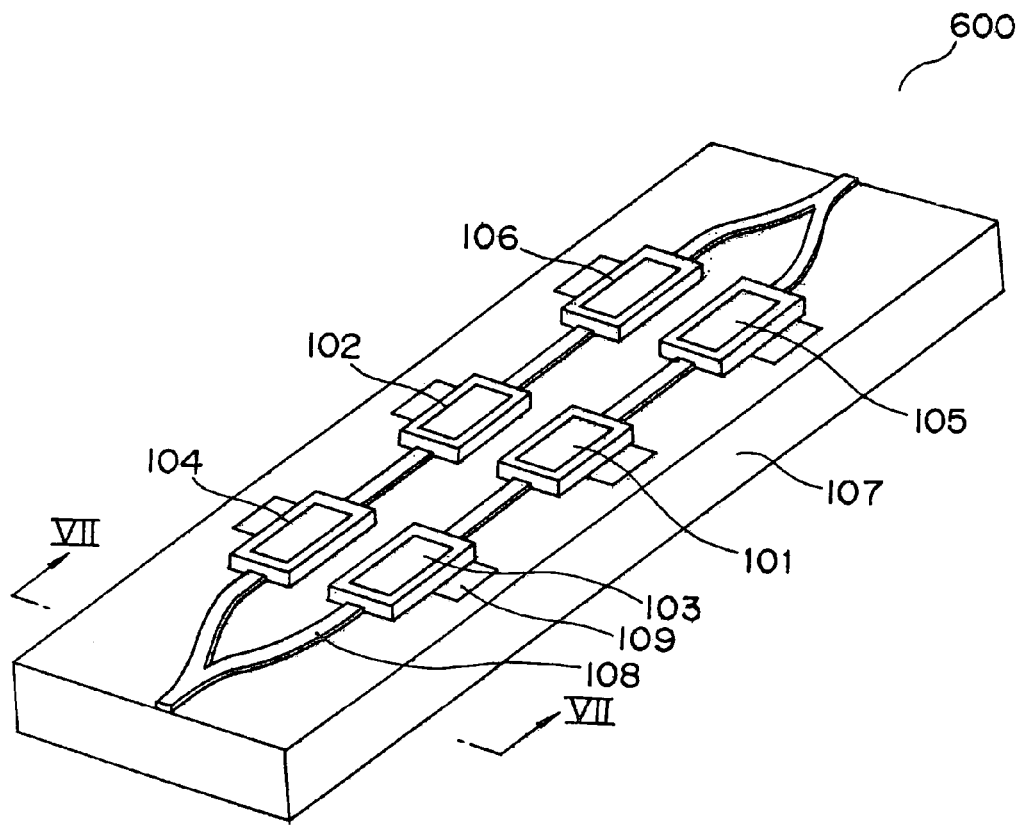
FIG. 7 is a schematic top view of an optical integrated circuit according to the fifth embodiment of the present invention.
Figure 8:
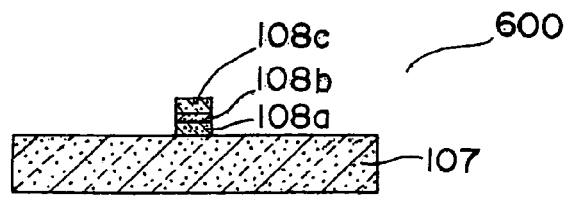
FIG. 8 is a cross-sectional view of the optical integrated circuit according to the fifth embodiment of the present invention.

FIG. 7 is a perspective view of a hybrid type optical integrated circuit of the fifth embodiment according to the present invention, generally denoted at 600. FIG. 8 is a cross-sectional view of the circuit taken on line VII—VII of FIG. 7.

The optical integrated circuit 600 has a substrate 107 made of silicon or quartz glass, for example. Semiconductor optical amplifiers 101 and 102 are fixed on the substrate 107 to amplify light, and semiconductor optical amplifiers 103, 104, 105 and 106 are also fixed on the substrate 107 to absorb light. These semiconductor optical amplifiers 101–106 are made separately from the substrate 107, and then is attached on the substrate 107. For example, the semiconductor optical amplifiers 101–106 are die bonded on the surface of the substrate 107 so that each surface of the amplifiers 101–106 having pn junction is contacted with the surface of the substrate 107 (junction down). Optical waveguides 108 are formed on the surface of the substrate 107 and are connected with the amplifiers 101–106. As shown in FIG. 8, the optical waveguide 108 essentially consists of core layer 108b made of silicon for instance, into which the upper and lower sides are inserted in the cladding layers 108a and 108c, and is formed on the surface of the substrate 107.

In the hybrid type optical integrated circuit as well as a monolithic type semiconductor optical amplifier circuit, the spontaneous emission light generated in the semiconductor optical amplifier for amplifying the light is reflected on the optical coupler, and then enter into the semiconductor optical amplifier again, so that the parasitic oscillation is generated in the semiconductor optical amplifier.

In the optical integrated circuit 600 according to the fifth embodiment of the present invention, each of the semiconductor optical amplifiers 103–106 for absorbing the light is formed between the semiconductor optical amplifier 101 or 102 for amplifying the light and the optical coupler, so that the semiconductor optical amplifiers 103–106 absorb the reflected light from the optical coupler. The semiconductor optical amplifiers 103–106 for absorbing the light are driven with lower current so that the loss of the reflected light is generated or the gain of the reflected light, if any, becomes smaller.

Each of the semiconductor optical amplifiers 103–106 may be replaced by an optical waveguides which absorb the reflected light from the optical coupler.

By using this structure, the optical gain of the hybrid type optical integrated circuit 600 can be enlarged without generating the parasitic oscillation in the semiconductor optical amplifiers 101 and 102 for amplifying the light.

What is claimed is:

1. A semiconductor optical integrated circuit comprising:
   a semiconductor substrate;
   first and second Y optical couplers having respective reflectances R1 and R2, each of the first and second Y optical couplers having a single input and first and second outputs;
   a first optical branch connecting the first outputs of the first and second Y optical couplers together, optically; and
   a second optical branch connecting the second outputs of the first and second Y optical couplers together, optically, wherein each of the first and second optical branches includes
   a gain section having a gain A, and
   respective optical wave guides coupling the first and second outputs of the first and second Y optical couplers to respective gain regions, each optical waveguide including first and second optical waveguide portions sandwiching a third optical waveguide portion which has an absorbance L, larger than absorbance of the first and second optical waveguide portions, wherein $A \cdot L \cdot R1 \cdot R2 < 1.$ 2. The semiconductor optical integrated circuit according to claim 1, wherein light emitted from at least one of the gain regions and reflected at one of the first and second optical Y couplers is absorbed by the third waveguide portion.

3. The semiconductor optical integrated circuit according to claim 1, wherein at least one of the first and second Y optical couplers includes a diffraction grating reflecting light passing through one of the first optical waveguide portions.

4. The semiconductor optical integrated circuit according to claim 1, wherein each of the first and second Y optical couplers includes an MMI optical coupler.

5. The semiconductor optical integrated circuit according to claim 1, wherein at least one of the first and second Y optical couplers includes an end face of the semiconductor substrate.

6. The semiconductor optical integrated circuit according to claim 1, wherein the first and second gain regions include an optical amplification portion amplifying light passing therethrough and emitting amplified light, and the second optical waveguide portions are connected to respective light outlet portions of the optical amplification portions.

7. The semiconductor optical integrated circuit according to claim 1, wherein at least one of the first and second gain regions and the second optical waveguide portions include an element separate from the semiconductor substrate, and the element is fixed on one of the semiconductor substrate and a quartz substrate.

8. The semiconductor optical integrated circuit according to claim 1, wherein the third optical waveguide portions are optical amplifiers.

* * * * *